United States Patent
Yang et al.

(10) Patent No.: US 6,518,909 B1
(45) Date of Patent: *Feb. 11, 2003

(54) ANALOG-TO-DIGITAL CONVERTER WITH MULTIPLEXED INPUT CHANNELS

(75) Inventors: David Xiao Dong Yang, Mountain View, CA (US); William R. Bidermann, Los Gotos, CA (US)

(73) Assignee: Pixim, Inc., Mountain View, CA (US)

( * ) Notice: Subject to any disclaimer, the term of this patent is extended or adjusted under 35 U.S.C. 154(b) by 37 days.

This patent is subject to a terminal disclaimer.

(21) Appl. No.: 09/965,600

(22) Filed: Sep. 25, 2001

Related U.S. Application Data

(63) Continuation of application No. 09/823,443, filed on Mar. 30, 2001, now Pat. No. 6,310,571.

(51) Int. Cl.[7] .............................................. H03M 1/38
(52) U.S. Cl. ...................... 341/155; 341/136; 341/169; 341/159; 341/161; 341/150; 341/152; 327/65; 327/563
(58) Field of Search ................................. 341/155, 169, 341/170, 159, 161, 152

(56) References Cited

U.S. PATENT DOCUMENTS

| | | | | |
|---|---|---|---|---|
| 4,599,602 A | * | 7/1986 | Matuzawa | 341/161 |
| 5,126,742 A | * | 6/1992 | Schmidt et al. | 341/169 |
| 5,307,067 A | * | 4/1994 | Kimura et al. | 341/155 |
| 5,313,207 A | * | 5/1994 | Kouno et al. | 341/156 |
| 5,461,425 A | | 10/1995 | Fowler et al. | 348/294 |
| 5,684,419 A | | 11/1997 | Murden et al. | 327/104 |
| 5,801,657 A | | 9/1998 | Fowler et al. | 341/155 |
| 6,310,571 B1 | * | 10/2001 | Yang et al. | 341/155 |

OTHER PUBLICATIONS

Yang, et al. A 640 x 512 CMOS Image Sensor with Ultra-wide Range Floating-Point Level ADC, IEEE Jornal of Solid-State Circuits, vol. No. 12, Dec. 1999, 1821-1834.

* cited by examiner

Primary Examiner—Michael Tokar
Assistant Examiner—Lam T. Mai
(74) Attorney, Agent, or Firm—Patent Law Group LLP; Carmen C. Cook

(57) ABSTRACT

A circuit includes an analog-to-digital (A/D) converter for multiplexing between a number of analog input signals and converting the selected analog input signals to a digital code representation. The A/D converter includes a comparator having a first input terminal connected to receive the first signal having a number of levels, a second input terminal connected to receive a multiple number of analog input signals, and a third input terminal for receiving a multiple number of input select signals. The comparator includes a multiplexer coupling the multiple number of analog input signals to a multiple number of corresponding input signal paths. The multiplexer selects one of the multiple number of input signal paths based on the multiple number of input select signals. In one embodiment, the A/D converter is applied in a digital image sensor for performing pixel-level analog-to-digital conversion using a multi-channel bit serial ADC technique.

17 Claims, 8 Drawing Sheets

ANALOG-TO-DIGITAL CONVERTER WITH MULTIPLEXED INPUT CHANNELS

This application is a continuation of application Ser. No. 09/823,443, filed Mar. 30, 2001, entitled "A Multiplexed Multi-Channel Bit Serial Analog-to-Digital Converter," now U.S. Pat. No. 6,310,571, issued Oct. 30, 2001, by David Xiao Dong Yang and William R. Bidermann, which application is incorporated herein by reference in its entirety.

FIELD OF THE INVENTION

The invention relates to analog-to-digital converters and, in particular, to analog-to-digital converters which generate a serial string of bits.

BACKGROUND OF THE INVENTION

A CMOS image sensor with pixel level analog-to-digital conversion is described in U.S. Pat. No. 5,461,425 of B. Fowler et al. ("the '425 patent"), incorporated herein by reference in its entirety. Such an image sensor, referred to as a digital pixel sensor (DPS), provides a digital output signal at each pixel element representing the light intensity detected by that pixel element. The combination of a photodetector and an analog-to-digital (A/D) converter in an area image sensor helps enhance detection accuracy and reduce power consumption, and improves overall system performance.

FIG. 1 duplicates FIG. 1 of the '425 patent and is a block diagram of a digital image sensor 10 as disclosed in the '425 patent. As is shown, digital image sensor 10 includes an image sensor core 12 which has a two-dimensional array of pixels. Each pixel 15 of sensor core 12 has a light detecting element (a photodetector or photosensor) coupled to a dedicated A/D converter. Each of the A/D converter outputs a stream of bits representative of the analog output of the associated light detecting element. In other words, the image sensor of the '425 patent outputs digital image data directly from each pixel. In a digital image sensor such as sensor 10 of FIG. 1, not only does the supporting circuitry for image sensor core 12 become dramatically simplified, there are also numerous advantages provided by the digital image sensor architecture in view of traditional CMOS image sensors. The advantages include better control of operations of the image sensor and far better image quality therefrom.

In the DPS array of the '425 patent, the analog-to-digital conversion (ADC) is based on first order sigma delta modulation. While this ADC approach requires fairly simple and robust circuits, it has the disadvantages of producing too much data and suffering from poor low light performance. U.S. Pat. No. 5,801,657 of Fowler et al. ("the '657 patent") provides an alternative ADC mechanism that can significantly improve the overall system performance while minimizing the size of the A/D converters. The '657 patent is incorporated herein by reference in its entirety.

The '657 patent discloses a multi-channel bit-serial (MCBS) analog-to-digital conversion scheme where bit-serial analog-to-digital conversion can be carried out for a potentially very large number of analog signals simultaneously. Therefore, the MCBS ADC scheme is suitable for use in pixel level ADC in a digital pixel sensor because a large number of pixel signal values need to be converted at the same time. FIG. 2 replicates FIG. 1A of the '657 patent and illustrates the basic architecture of the MCBS ADC technique. In FIG. 2, A/D converter 14 can support a multiple number of input channels, such as Channel 0 to Channel N, where each input channel is associated with an analog input signal In0 to InN. Each input channel contains an 1-bit comparator 16a–n and a 1-bit latches 17a–n. Comparators 16a–n and latch 17a–n are controlled by external control signals RAMP and BITX. The two control signals are generated by a micro-controller 18 and a digital-to-analog (D/A) converter 19 and are broadcast to all input channels, Channel 0 to Channel N.

The MCBS ADC scheme of the '657 patent provides several advantages. First, because all input channels are operated simultaneously, maximum throughput can be achieved. Second, because each input channel uses simple circuitry, i.e. each input channel includes only one 1-bit comparator and one 1-bit latch, the A/D converter consumes minimum circuit area in implementation. Furthermore, because the more complicated control circuitry, such as micro-controller 18, are shared among all input channels, the overhead of the control circuitry is spread among all of the input channels. These advantages make MCBS A/D converter suitable for use in digitizing systems with a very large number of input channels, such as a digital image sensor with pixel-level A/D converters.

In the digital image sensor of FIG. 1, each pixel element includes a dedicated A/D converter. However, adding a dedicated A/D converter to each of the light detecting elements in an image sensor could introduce some practical problems limiting the practical application of such digital image sensors. One of the problems is that image sensor core 12 is inevitably larger than it would be without the dedicated A/D converters. If an image sensor is desired to have millions of photodetectors thereon, there would be a large number of dedicated A/D converters, which could take a significant amount of circuit area to implement in the image sensor core. Larger image sensor cores are undesirable because they typically lead to higher manufacturing cost and lower yield.

The '657 patent proposes an alternative sensor array architecture where an A/D converter is shared among a group of neighboring pixel elements. FIG. 3 is a block diagram of a digital image sensor where an A/D converter is associated with four photodetectors in an image sensor array. In digital image sensor 20 of FIG. 3, sensor array 22 includes a two-dimensional array of photodetectors 24. Instead of providing a dedicated ADC circuit to each photodetector, an ADC circuit 26 is shared among a group of four neighboring photodetectors 24. Each of the ADC circuit 26 performs A/D conversion of the output voltage signal by multiplexing between the four neighboring photodetectors. Although the image capture time becomes four times longer in the shared-ADC architecture of FIG. 3 than the dedicated-ADC architecture of FIG. 1, the shared-ADC architecture of FIG. 3 has the advantage of retaining all of the benefit of pixel level analog-to-digital conversion while using a much smaller circuit area, thus reducing manufacturing cost and improving yield. The shared-ADC architecture is also described in "A 640×512 CMOS Image Sensor with Ultrawide Dynamic Range Floating-Point Pixel-Level ADC," by David X. D. Yang et al., IEEE Journal of Solid-State Circuits, Vol. 34, No. 12, December 1999, p. 1821–1834, which reference is incorporated by reference in its entirety.

The '657 patent describes various schemes for multiplexing the four neighboring pixel elements to the associated A/D converter. FIG. 4 is a block diagram illustrating a multiplexing scheme described in the '657 patent. In FIG. 4, four pixel elements, illustrated as photodiodes D0 to D3, are multiplexed onto a single input terminal Inm of comparator 16 through four NMOS transistors 31–34 functioning as switches. The control terminals (or gate terminals) of transistors 31–34 are coupled to select signals S0 to S3. At any one time, only one of the select signals S0 to S3 will go high to cause one of NMOS transistors 31 to 34 to turn on, thus coupling the analog pixel charge voltage at the respective photodiode to the input terminal Inm of comparator 16.

The multiplexing scheme of FIG. 4 has several disadvantages. First, this multiplexing scheme makes implementation of multiple sampling very difficult. Multiple sampling is a technique capable of achieving a wide dynamic range without many of the disadvantages associated with other dynamic range enhancement techniques, such as degradation in signal-to-noise ratio and increased implementation complexity. Copending and commonly assigned U.S. patent application Ser. No. 09/567,786, entitled "Multiple Sampling via a Time-indexed Method to Achieve Wide Dynamic Ranges" of David Yang et al., describes a method for facilitating image multiple sampling using a time-indexed approach. Multiple sampling operation involves performing multiple reads from the sensor array over time and then normalizing the readout values based on the multiple sampling information. An image based on the normalized pixel data can be created with a simulated sensitivity range much greater than the actual sensitivity range of the sensor elements. However, it is difficult to apply multiple sampling to an image sensor implementing a shared-ADC architecture using the multiplexing scheme shown in FIG. 4. This is because the multiplexing scheme in FIG. 4 results in cross-talk between the four neighboring photodiodes D0 to D3 such that pixel intensity values recorded by the four photodiodes can be rendered useless. For example, at each sampling time, transistors 31 to 34 are turned on in sequence to transfer the charge on the respective photodiode to the input terminal Inm. Because the voltages at the photodiodes are not reset between each sampling of an image and because each photodiode is sampled onto the same input node, a large cross-talk among the different photodiodes D0 to D3 exists, destroying all meaningful pixel signal values.

Another disadvantage associated with the use of the multiplexing scheme of FIG. 4 is that transistors 31–34 must be carefully designed to avoid introducing noise and non-linearity into the pixel values. Because transistors 31–34 typically have a large gate voltage swing (e.g. from 0 to 5 volts), a large gate switching feedthrough can result to cause a large offset at the photodiodes which may vary from pixel to pixel, resulting in fixed pattern noise.

Therefore, it is desirable to provide a method for implementing the shared-ADC architecture in a digital pixel sensor while avoiding the aforementioned disadvantages.

SUMMARY OF THE INVENTION

In accordance with one embodiment of the present invention, a circuit includes an analog-to-digital (A/D) converter for multiplexing between a number of analog input signals and converting the selected analog input signals to a digital code representation. The A/D converter includes a first signal generator for generating a first signal having a multiple number of levels and a comparator having a first input terminal connected to receive the first signal. The comparator has a second input terminal connected to receive a multiple number of analog input signals, each analog input signal to be converted into a digital value, and a third input terminal for receiving a multiple number of input select signals. Furthermore, the comparator includes a multiplexer coupling the multiple number of analog input signals to a multiple number of corresponding input signal paths. The multiplexer selects one of the multiple number of input signal paths based on the multiple number of input select signals. The A/D converter further includes a binary signal generator for generating a series of binary signals, and a latch having a first input terminal coupled to receive an output signal of the comparator. The latch has a data input terminal coupled to receive the series of binary signals. An output signal of the comparator controls when the latch provides an output signal corresponding to a binary signal applied to the data input terminal. In operation, the latch provides at least a portion of an N-bit digital code representing at least one of the analog input signals applied to the second input terminal of the comparator.

In one embodiment, the A/D converter is applied in a digital image sensor for performing pixel-level analog-to-digital conversion using a multi-channel bit serial ADC technique. The A/D converter can be applied in a shared-ADC architecture while still permitting the digital image sensor to practice multiple sampling for enhancing the dynamic range of the image sensor.

The present invention is better understood upon consideration of the detailed description below and the accompanying drawings.

BRIEF DESCRIPTION OF THE DRAWINGS

In the present disclosure, like objects which appear in more than one figure are provided with like reference numerals.

DETAILED DESCRIPTION OF THE PREFERRED EMBODIMENTS

According to the present invention, a multiplexed multi-channel bit serial (MCBS) analog-to-digital (A/D) converter performs analog-to-digital conversion of two or more analog input signals by coupling the analog input signals to corresponding input signal paths in a comparator of the A/D converter and multiplexing the input signal paths. By using the multiplexing scheme of the present invention, multiple analog input signals can be digitized using the same A/D converter without the damaging effect of cross-talks between the analog input signals or the introduction of noise in the analog values. The multiplexing scheme of the present invention can be applied in a digital pixel sensor for implementing the shared-ADC architecture where one A/D converter is shared among a number of neighboring pixel elements.

Figure 5:
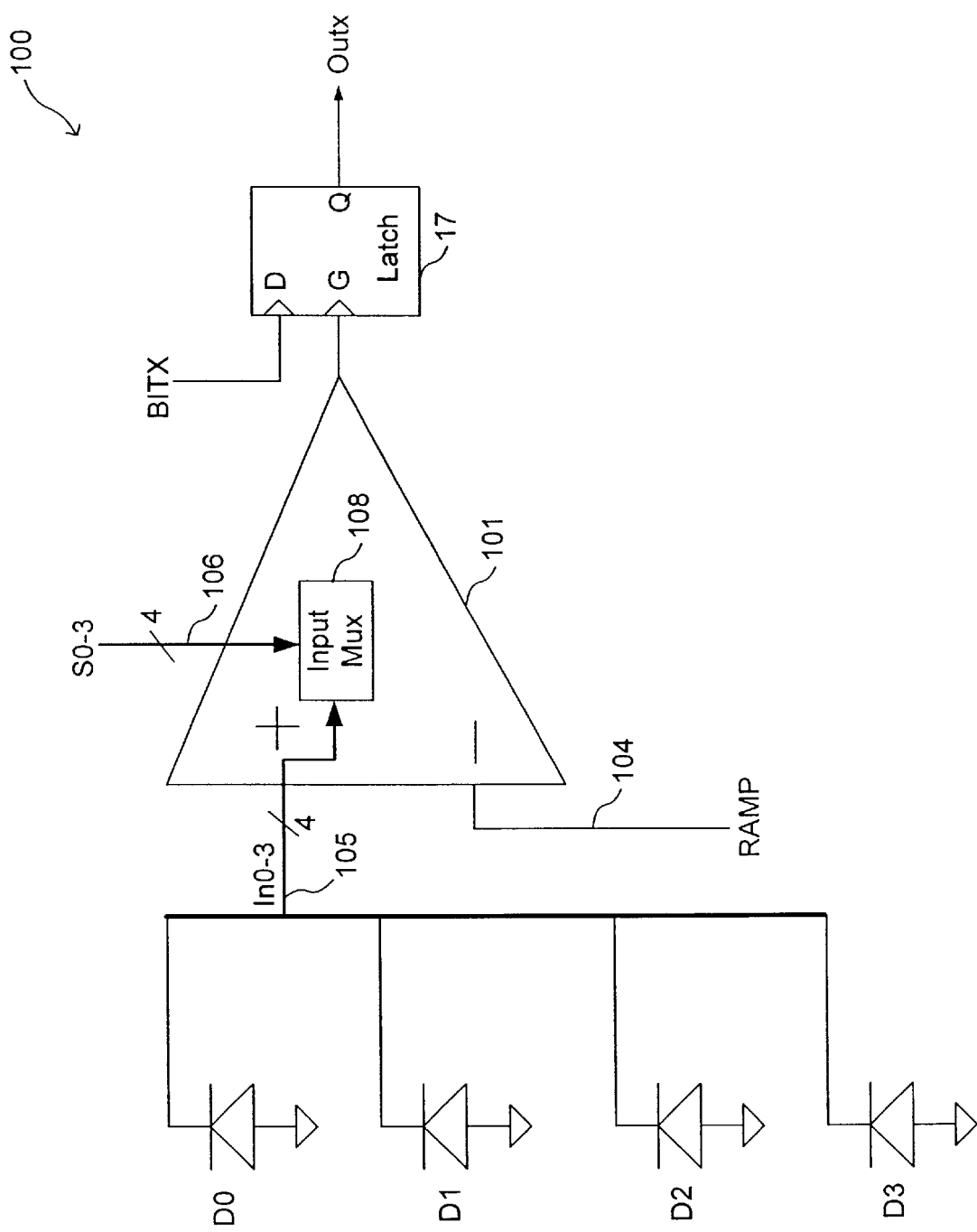
FIG. 5 is a block diagram of an A/D converter according to one embodiment of the present invention.

FIG. 5 is a block diagram of an A/D converter according to one embodiment of the present invention. In the following description, like elements appearing in more than one figure are given like reference numerals to simplify the description. In FIG. 5, A/D converter 100 is coupled to multiplex between four analog signals In0–3 generated by photodiodes D0 to D3 and perform MCBS analog-to-digital conversion of the four analog signals as selected. A/D converter 100 generates an output signal Outx representing a digital code associated with the selected analog signals. Although in the present description, A/D converter 100 is described as being applied in a digital image sensor for performing pixel level ADC, one of ordinary skill in the art would appreciate that A/D converter 100 can be used in other applications for multiplexing between a number of analog signals of any types and digitizing each of the analog signals as selected. Furthermore, while A/D converter 100 is illustrated as multiplexing between four analog signals, one of ordinary skill in the art would appreciate that A/D converter 100 can be used to multiplex between any number of analog signals based on individual design choice.

In accordance with the present invention, A/D converter 100 implements the multi-channel bit-serial (MCBS) analog-to-digital conversion technique described in the aforementioned '657 patent. In the embodiment shown in FIG. 5, A/D converter 100 is illustrated with only one input channel including a 1-bit comparator 101 and a latch 17. Of course, this is illustrative only and A/D converter 100 can be configured to include a multiple number of input channels, each channel disposed to multiplex between a multiple number of analog input signals. Furthermore, A/D converter 100 includes global control circuitry (not shown) for generating the RAMP signal and the BITX signal in the same manner as described in the '657 patent. A/D converter 100 operates to digitize a selected one of the analog input signals In0–3 using the MCBS ADC technique in the same manner as described in the '657 patent.

Comparator 101 of A/D converter 100 includes a negative input terminal 104 coupled to receive the RAMP signal and a positive input terminal 105 coupled to receive analog input signals In0–3. Comparator 101 also includes a select input terminal 106 for receiving input select signals S0–3. Input select signals S0–3 are used to control an input multiplexer 108 in comparator 101 for selecting one of the four analog input signals In0–3 received on the positive input terminal for analog-to-digital conversion. As will be explained in more detail below, input multiplexer 108 operates to multiplex between analog input signals In0–3 while preventing cross-talk between the analog input signals. Thus, A/D converter 100, incorporating comparator 101, can be shared among a multiple number of analog input signals while preserving the signal integrity of each of the analog input signals.

Figure 1:
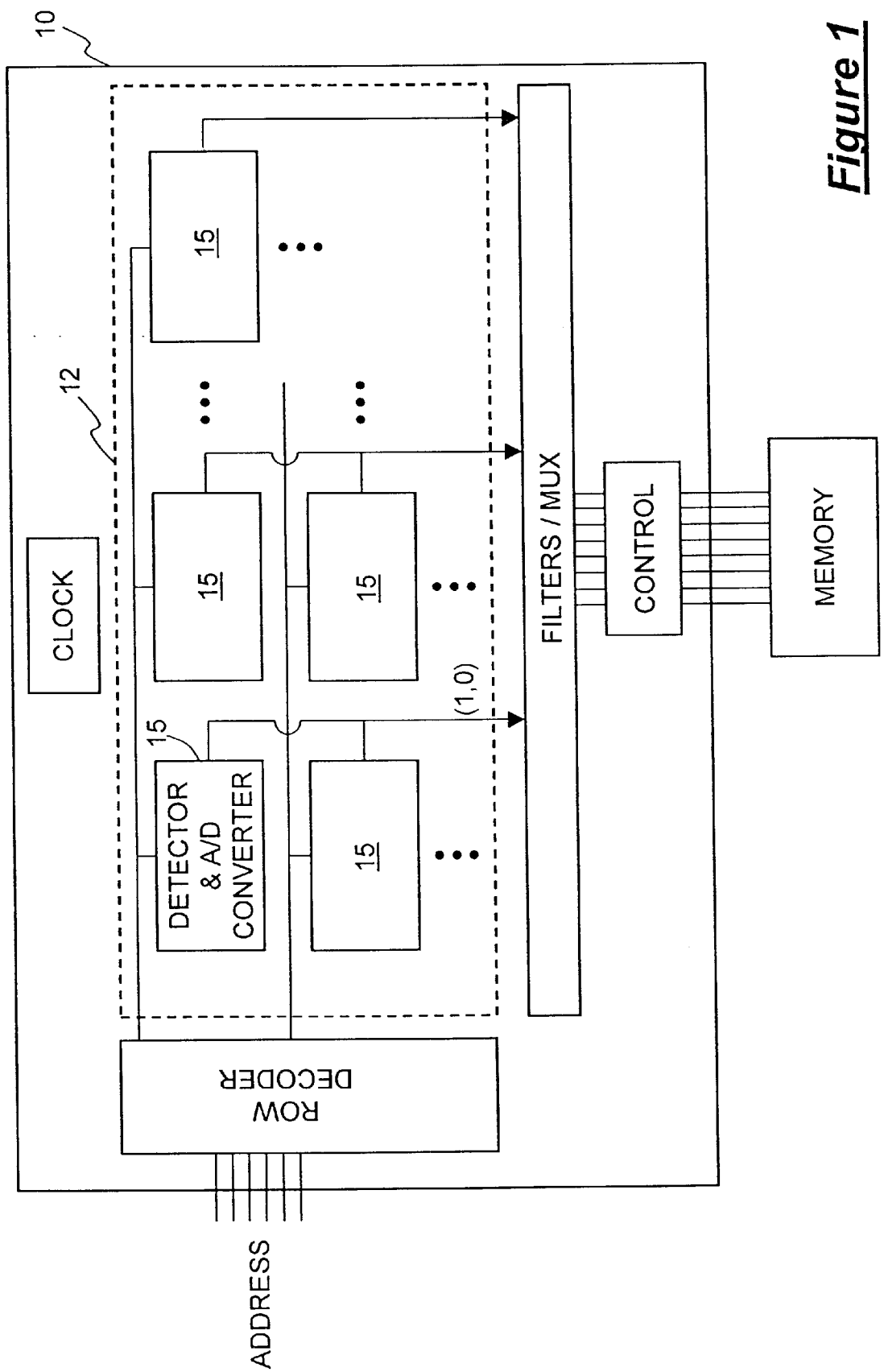
FIG. 1 is a block diagram of a digital image sensor as disclosed in the '425 patent.
Figure 2:
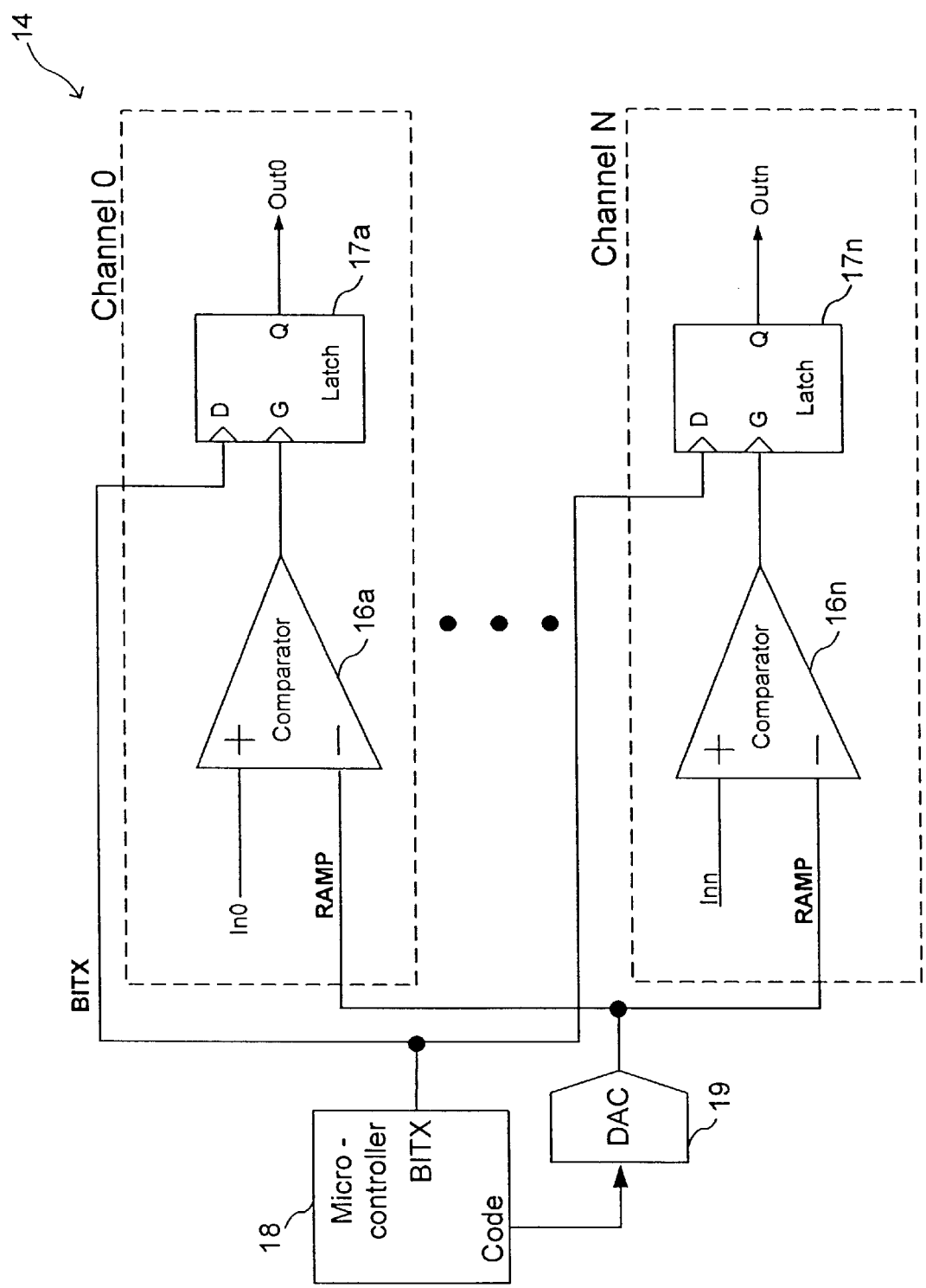
FIG. 2 illustrates the basic architecture of the MCBS ADC technique as disclosed in the '657 patent.
Figure 4:
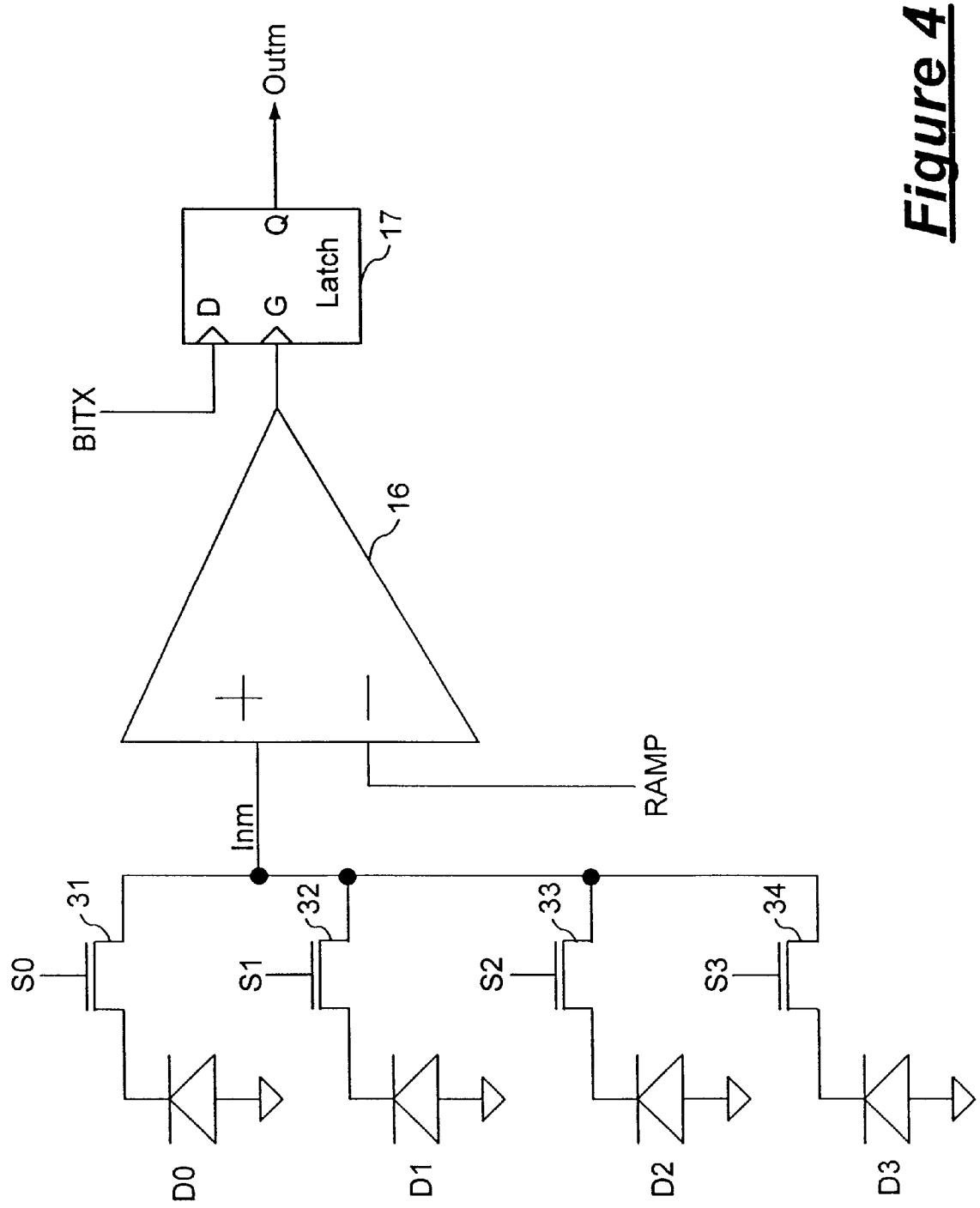
FIG. 4 is a block diagram illustrating a multiplexing scheme described in the '657 patent.
Figure 6:
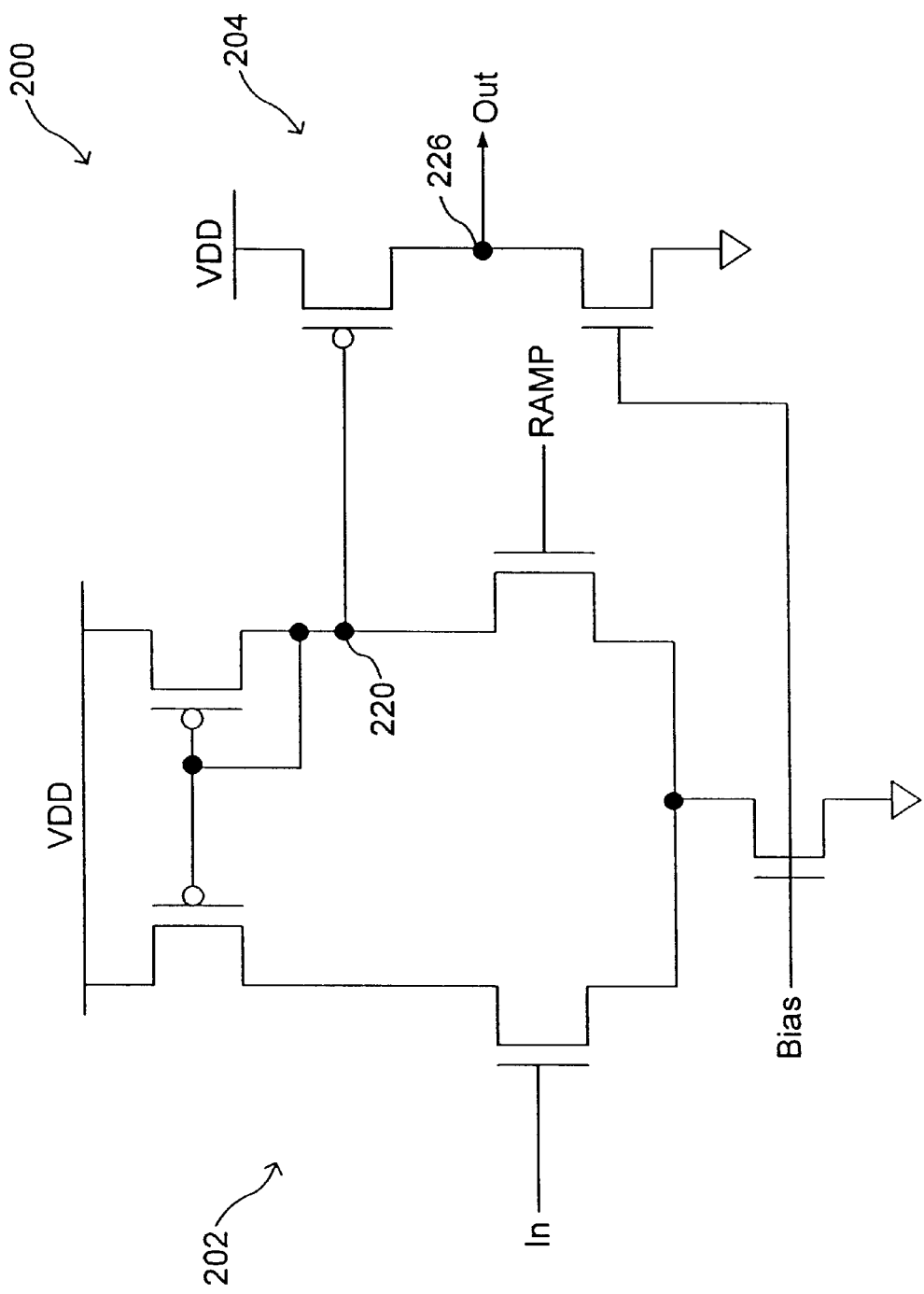
FIG. 6 is a circuit diagram of an exemplary implementation of an 1-bit comparator of FIGS. 2 and 4.

Referring to FIGS. 2 and 4, the 1-bit comparator in the '657 patent is typically implemented using a classic two-stage Op Amp/comparator configuration. An exemplary implementation of the 1-bit comparator is shown in FIG. 6. The first stage of comparator 200 includes a differential pair 202, a current mirror and a bias transistor controlled by a Bias voltage providing a reference current. Differential pair 202 includes a pair of NMOS transistors for receiving the two input signals In and RAMP for comparison. Differential pair 202 provides an output signal at an output node 220 representative of the difference between the analog input signal In and the RAMP signal. In the second stage, comparator 200 includes an inverter 204 for inverting and amplifying the output signal from differential pair 202 and generating a comparison result (signal Out) at node 226. The operation of comparator 200 is well known and a detailed description can be found in the '657 patent. In the multiplexing scheme of FIG. 4, transistors 31 to 34 operate to switch one of the four analog input signals onto the input terminal In of comparator 200. As discussed above, the multiplexing scheme of FIG. 4 permits cross-talk to occur between the analog input signals, thus degrading or destroying the signal levels. In accordance with the present invention, comparator 101 incorporates a novel multiplexing scheme to enable A/D converter 100 to multiplex between multiple number of analog input signals without the adverse effect of cross-talk between the signals. As will be described in more detail below, comparator 101 includes multiplexer 108 for multiplexing the input signal paths in the comparator so that cross-talk between signals are eliminated and comparator 101 can be used to multiplex any number of analog input signals without degrading or destroying the signal integrity.

Figure 7:
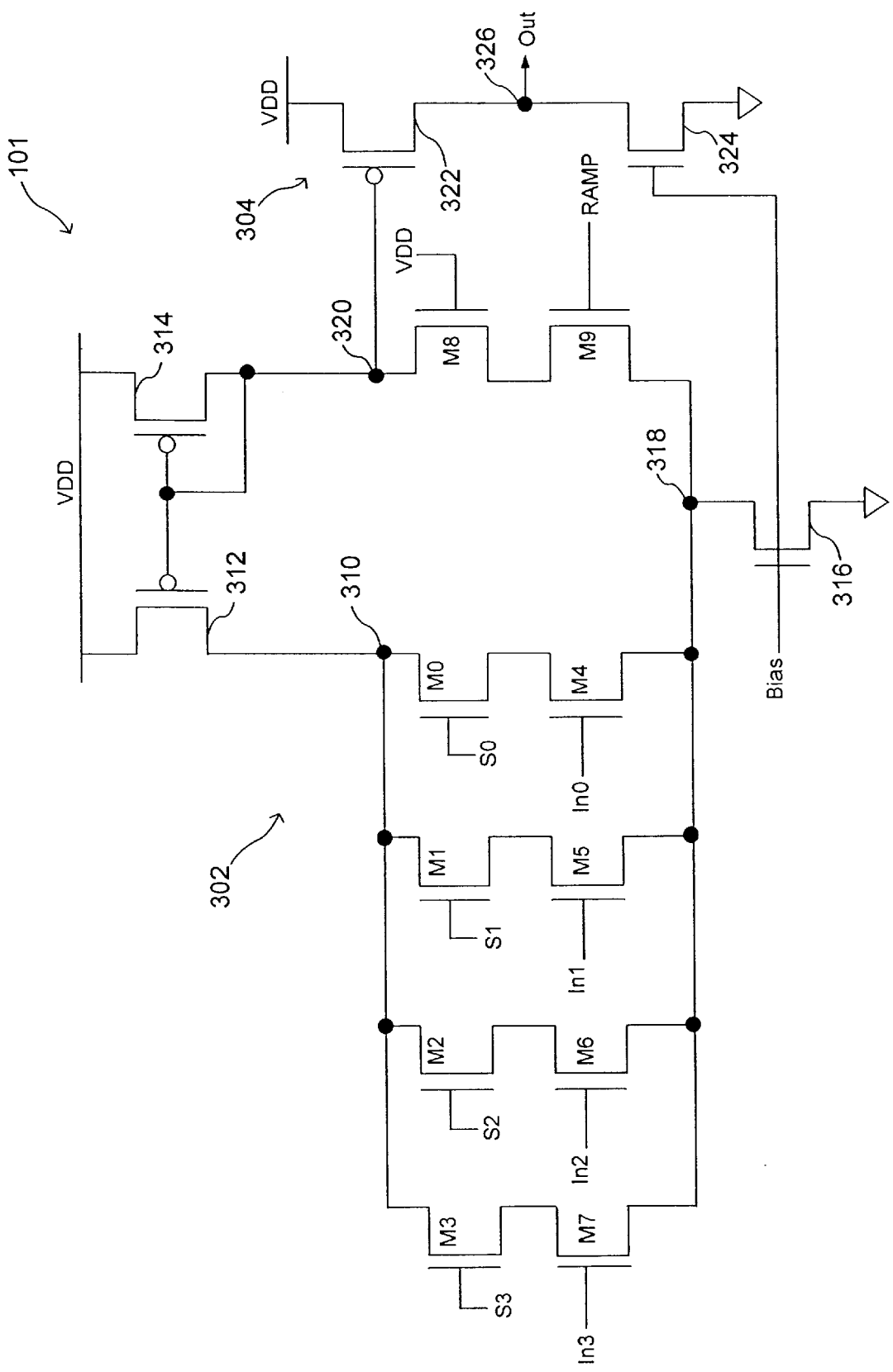
FIG. 7 is a circuit diagram illustrating one embodiment of the 1-bit comparator for use in the A/D converter of FIG. 5.

FIG. 7 is a circuit diagram illustrating one implementation of comparator 101 in A/D converter 100 of FIG. 5 according to one embodiment of the present invention. Comparator 101 includes two stages. The first stage includes a differential pair 302, a current mirror formed by PMOS transistors 312 and 314, and a bias transistor 316. Differential pair 302 includes transistors M0 to M7 forming the first branch of the differential pair and transistors M8 and M9 forming the second branch. Transistor 316 is an NMOS transistor coupled between node 318 and ground and having it gate terminal controlled by a Bias voltage signal. Transistor 316 provides a reference current at a node 318. The second stage of comparator 101 includes an inverter 304 formed by serially connected PMOS transistor 322 and NMOS transistor 324.

The first branch of differential pair 302 includes four input signal paths and incorporates multiplexer 108 for selecting one of the four input signal paths for comparison with the RAMP signal received at the second branch of the differential pair. Specifically, transistors M0 to M3, controlled by input select signals S0 to S3, functions as multiplexer 108 for enabling one of the four input signal paths. As illustrated in FIG. 7, serially connected transistors M0 and M4 form one input signal path for receiving analog input signal In0, generated by a photodiode (not shown) for example. Similarly, serially connected transistor pairs M1 and M5, M2 and M6, and M3 and M7 form a second, third and fourth input signal paths for receiving analog input signals In1, In2 and In3 respectively. In operation, at any one time, only one of input select signals S0–3 is enabled (at a logic high level) for turning on one of transistors M0 to M3. Then, the analog input signal of the selected input signal path is available at node 310 for comparison with the RAMP signal. In FIG. 5, comparator 101 is illustrated with multiplexer 108 for multiplexing four input signal paths. Of course, comparator 101 can be configured to multiplex between any number analog input signals by providing the corresponding number of input signal paths.

In the present embodiment, the second branch of differential pair 302 includes a pair of serially connected NMOS transistors M8 and M9. The gate terminal of transistor M8 is connected to the VDD voltage. Therefore, transistor M8 remains turned on in operation and provides a resistive load for transistor M9 which receives the RAMP input signal. Transistor M8 is included in differential pair 302 to equalize the resistive load at both branches of the different pair (that is, at nodes 310 and 320) so that effective comparison can be performed. Because the input signal path in the first branch includes two NMOS transistors connected in series, the input signal path in the second branch also needs to have the same number of equally sized transistors. Of course, other method for equalizing the resistive load at the first and second branches of differential pair 302 can be used, such as by appropriately sizing transistor M9 or by providing a resistor in lieu of transistor M8. Furthermore, while in the embodiment shown in FIG. 7, the gate terminal of transistor M8 is shown connected to the VDD voltage, this is illustrative only and in other embodiments, the gate terminal of transistor M8 can be connected to a reference voltage other than the VDD voltage as long as the reference voltage is sufficiently high to turn the transistor on. In that case, the input select signals S0 to S3 will also rise to the same reference voltage when the respective signal is to be turned on (i.e., at a logic high level).

The output signal of differential pair 302 (node 320) is coupled to inverter 304 for inversion and amplification. Specifically, inverter 304 includes an NMOS transistor 324 having it gate terminal coupled to the Bias voltage signal and a PMOS transistor 322 having it gate terminal coupled to the output signal of differential pair 302 (node 320). The output signal (node 326) of inverter 304 is a digital code representative of the analog signal being digitized.

The novel multiplexing scheme of the present invention involving incorporating multiplexer 108 in the input signal paths of comparator 101 provides several advantages. First, by avoiding placing a switching transistor in series with the source of the analog input signals, cross-talk between the input analog signals is minimized. Second, because the multiplexing of input signal paths does not degrade signal integrity, A/D converter 100 is free to "observe" the analog input signals as long as it needs and as often as it needs. Repetitive reading of the analog signals does not destroy the signal level. Thus, when a digital pixel sensor incorporates A/D converter 100 of the present invention for pixel-level ADC, the digital image sensor can perform multiple sampling of an image while multiplexing one ADC circuit (or one input channel of the ADC circuit) between two or more pixels. Multiple sampling operation can be carried out without requiring resetting of the analog input signals at each sampling. Third, since A/D converter 100 implements the MCBS ADC technique which is a bit-serial ADC, each bit of the digital code representative of the analog signal is converted and outputted independently of the other bits. The multiplexing scheme of the present invention provides flexibility in the analog-to-digital conversion process. Thus, when the multiplexing scheme in comparator 101 of FIG. 7 is used, it is possible to interleave A/D conversion on a bit by bit basis among four analog input signals. Thus, A/D converter 100 can convert the most significant bit (MSB) of each of analog input signals In0, In1, In2 and In3 before moving on to convert the next lower order bits of the input signals. In certain applications, such an interleaving A/D conversion process may be desirable.

Figure 8:
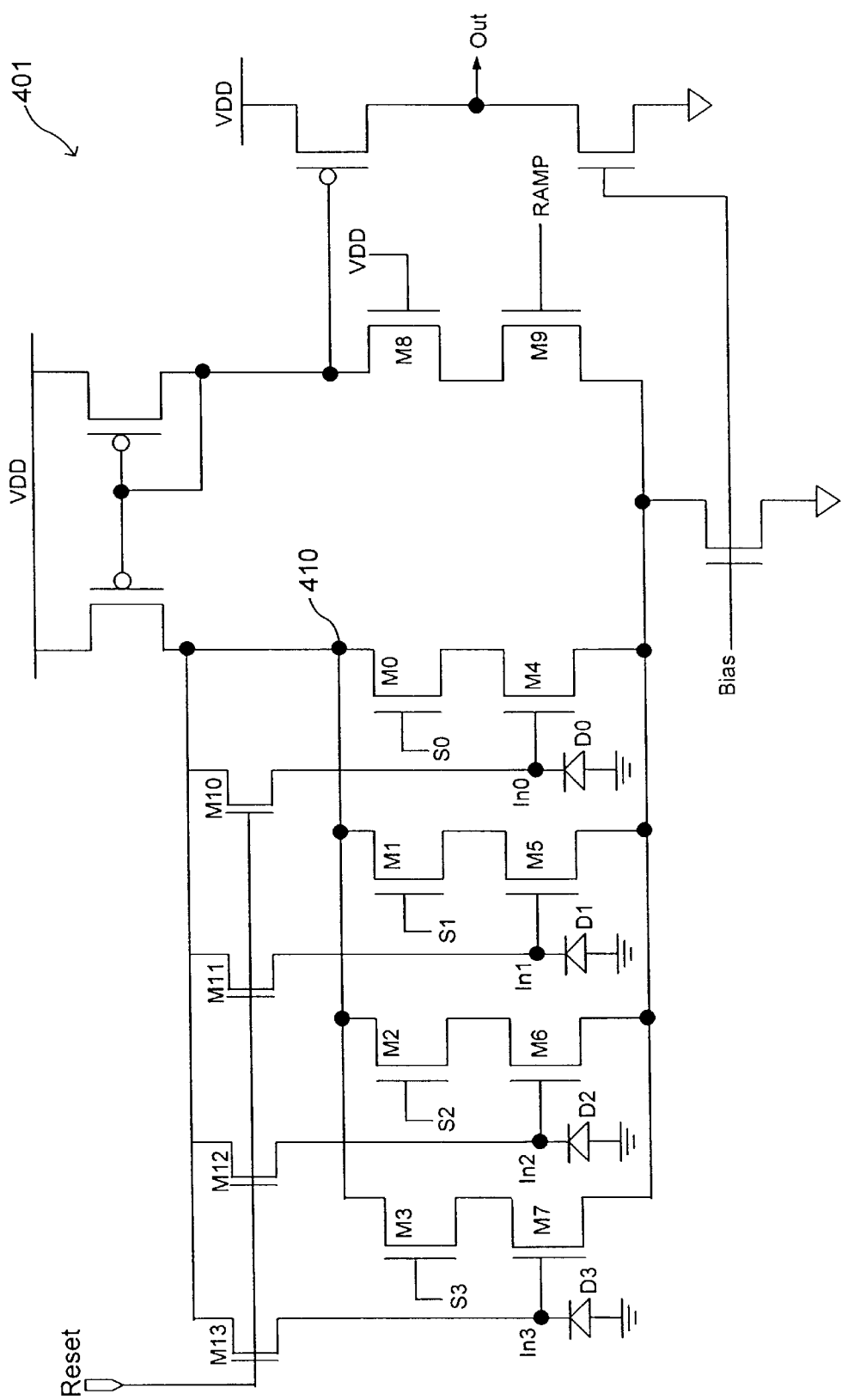
FIG. 8 is a circuit diagram illustrating another embodiment of the comparator circuit for use with the analog-to-digital converter in accordance with the present invention.

In a digital pixel sensor incorporating pixel level ADC, a reset operation is performed after an image is captured to reduce the comparator offset voltage. Analog autozeroing operation is also performed during the reset operation which has the effect of reducing fixed pattern noise and 1/f noise. In the '657 patent, the reset operation is performed by including a reset transistor which, when activated, causes the comparator to operate as an Op Amp in a unity gain feedback loop. The reset operation can be incorporated in the A/D converter of the present invention by providing a reset transistor for each input signal paths in the comparator of the A/D converter. FIG. 8 illustrates another embodiment of the comparator circuit of the present invention including reset transistors for performing reset and autozeroing operations. Comparator 401 of FIG. 8 is constructed in the similar manner as comparator 101 of FIG. 7. Here, the analog input signals of comparator 401 are shown coupled to photodiodes D0 to D3 to illustrate that comparator 401 is being applied in a digital image sensor to carry out pixel level ADC. To incorporate the reset operation in comparator 401, NMOS transistors M10 to M13, acting as reset transistors, are included in comparator 401 and are each coupled between node 410 and the respective analog input terminals of the input signal path. Thus, transistor M10 is coupled between node 410 and the gate terminal of transistor M4 receiving analog input signal In0. Similarly, transistors M11 to M13 are coupled between node 410 and the respective gate terminals of transistors M5 to M7. In the embodiment shown in FIG. 8, reset transistors M10 to M13 are controlled by the same Reset signal generated by control circuitry external to the A/D converter. Therefore, photodiodes D0 to D3 are reset at the same time. Of course, it is possible to provide different reset signals to each of reset transistors M10 to M13 so that photodiodes D0 to D3 are individually reset.

Figure 3:
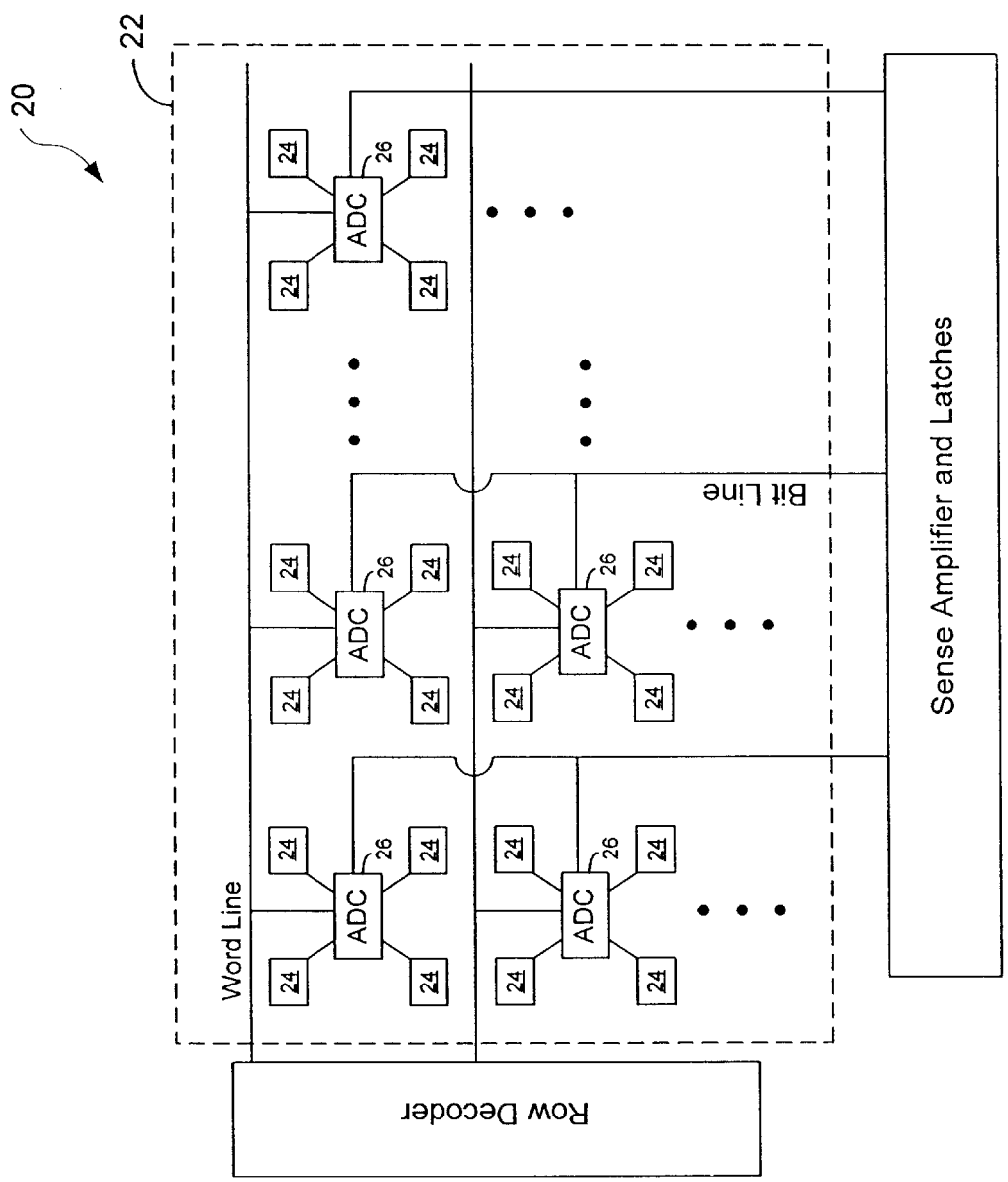
FIG. 3 is a block diagram of a digital image sensor where an A/D converter is associated with four photodetectors in an image sensor array.

According to one embodiment of the present invention, the A/D converter of the present invention is implemented in digital image sensor 20 of FIG. 3 for multiplexing between four neighboring pixel elements 24. ADC circuit 26 is replaced with A/D converter 100 of FIG. 5 incorporating the novel multiplexing scheme of the present invention. The shared-ADC architecture of FIG. 3 illustrates a configuration where four neighboring pixel elements share one ADC circuit. Of course, other pixel elements-to-ADC circuit ratios can be used depending on layout design choice and speed considerations. Digital image sensor 20 may include other control circuitry such as a clock generation circuit and other global control circuitry which are not shown in FIG. 3.

In the above description, the novel multiplexing scheme of the present invention is applied to the input signal paths of a comparator implemented using two-stage differential pair/inverter configuration. Of course, this is illustrative only and one of ordinary skill in the art would appreciate that the novel multiplexing scheme of the present invention can be applied to other comparator configurations as well. In fact, the multiplexing scheme of the present invention can be applied to multiplex the input signal paths of a variety of comparator configurations. For example, the novel multiplexing scheme of the present invention can also be applied to a comparator including a cascode stage as the first stage. In that case, the input signal paths of the cascode stage are multiplexed according to the present invention so that the comparator can be shared among a number of analog input signals.

The above detailed descriptions are provided to illustrate specific embodiments of the present invention and are not intended to be limiting. Numerous modifications and variations within the scope of the present invention are possible. For example, while the comparators in FIGS. 7 and 8 are implemented using MOS transistors. Other transistor devices can be used as understood by one of ordinary skill in the art. Furthermore, the comparators of FIGS. 7 and 8 can be implemented using opposite type of MOS transistors (that is, PMOS transistors in place of NMOS transistors and vice versa) with the corresponding change in the polarity of the bias and control voltages as understood by one of ordinary skill in the art. The present invention is defined by the appended claims.

We claim:

1. A circuit comprising:
   an analog-to-digital (A/D) converter for converting each of a plurality of analog input signals to a digital value, comprising:

a comparator having a first input terminal coupled to receive a first signal having a plurality of levels, a second input terminal coupled to receive said plurality of analog input signals, and a third input terminal for receiving an input select signal, said comparator including a multiplexer coupling said plurality of analog input signals to a plurality of corresponding input signal paths, said multiplexer selecting one of said plurality of input signal paths based on said input select signal; and a latch having a first input terminal coupled to receive an output signal of said comparator, said latch having a data input terminal coupled to receive a series of binary signals, an output signal of said comparator controlling when said latch provides an output signal corresponding to a binary signal applied to said data input terminal;

wherein said comparator comparing said first signal with a selected one of said plurality of analog input signals to generate said output signal, and said latch provides at least a portion of an N-bit code representing said selected one of said plurality of analog input signals applied to said second input terminal of said comparator.

2. The circuit of claim 1, wherein said N-bit digital code is a Gray code.

3. The circuit of claim 1, further comprising:
a first signal generator generating a series of binary codes representing analog levels, said first signal generator comprising a digital-to-analog converter connected to receive said binary codes and to generate said first signal being connected to said first input terminal of said comparator.

4. The circuit of claim 1, wherein said first signal is an analog ramped signal for each bit of said N-bit digital code.

5. The circuit of claim 1, further comprising: a binary signal generator for generating said series of binary signals.

6. The circuit of claim 1, wherein said input select signal comprises a plurality of input select bits, each of said plurality of input select bits being coupled to select one of said plurality of analog input signals.

7. The circuit of claim 6, wherein said comparator comprises:
a differential pair comprising:
a first transistor having a control terminal coupled to receive said first signal, a first current handling terminal coupled to a current mirror, and a second current handling terminal coupled to a current source, said first current handling terminal of said first transistor being an output terminal of said differential pair;
a first node coupling said plurality of input signal paths to said current mirror, each of said plurality of input signal paths including a second transistor and a third transistor connected in series between said first node and said current source, said second transistor having a control terminal coupled to a respective one of said input select bits, and said third transistor having a control terminal coupled to a respective one of said plurality of analog input signals;
wherein said input select bits selectively enable one of said plurality of input signal paths; and
an inverter having an input terminal coupled to said output terminal of said differential pair and generating said output signal of said comparator.

8. The circuit of claim 7, wherein said differential pair of said comparator further comprises a fourth transistor coupled between said current mirror and said first current handling terminal of said first transistor, said fourth transistor having a control terminal coupled to a first reference voltage turning said fourth transistor on, a first current handling terminal of said fourth transistor being said output terminal of said differential pair.

9. The circuit of claim 8, wherein said first reference voltage is a positive power supply voltage VDD of said circuit.

10. The circuit of claim 7, wherein said comparator further comprises:
a plurality of reset transistors, each of said reset transistors having a control terminal coupled to receive a reset signal, a first current handling terminal coupled to said first node, and a second current handling terminal coupled to said control terminal of said third transistor of a respective one of said plurality of input signal paths.

11. The circuit of claim 10, wherein said reset signal comprises a plurality of reset signals, and each of said control terminal of said reset transistors is coupled to a respective one of said plurality of reset signals.

12. The circuit of claim 7, wherein said current source comprises a fifth transistor having a control terminal coupled to a bias voltage, a first current handling terminal coupled to said second current handling terminal of said first transistor and providing a reference current, and a second current handling terminal coupled to a second reference voltage.

13. The circuit of claim 12, wherein said second reference voltage is a ground voltage.

14. The circuit of claim 7, wherein said current mirror comprises a sixth transistor and a seventh transistor, gate terminals of said sixth and seventh transistors being connected together and to a first current handling terminal of said seventh transistor, said first current handling terminal of said seventh transistor also coupled to said first current handling terminal of said first transistor, a first current handling terminal of said sixth transistor being coupled to said first node, and second current handling terminals of said sixth and seventh transistors being coupled to a first reference voltage.

15. The circuit of claim 1, further comprising:
an image sensor formed as an integrated circuit having a plurality of photodetectors, said photodetectors formed within an image sensor array, each of said photodetectors generating an analog signal, said comparator and said latch being formed within said image sensor array proximate to said photodetectors for converting an analog signal generated by at least one photodetector into a digital code,
wherein said comparator is one of a plurality of comparators and said latch is one of a plurality of latches all formed within said image sensor array as part of a plurality of analog-to-digital converters.

16. The circuit of claim 15 wherein one comparator and one latch are associated with a group of photodetectors, each of said photodetectors generating one of said plurality of analog input signals.

17. The circuit of claim 1 further comprising:
an image sensor formed as an integrated circuit having a plurality of photodetectors, each of said photodetectors generating an analog signal, said photodetectors being formed with an image sensor array, and wherein said A/D converter is formed external to said image sensor array.

* * * * *